United States Patent [19]

Logan et al.

[11] Patent Number: 5,055,964
[45] Date of Patent: Oct. 8, 1991

[54] ELECTROSTATIC CHUCK HAVING TAPERED ELECTRODES

[75] Inventors: Joseph S. Logan, Poughkeepsie; Raymond R. Ruckel, Garrison; Robert E. Tompkins, Pleasant Valley; Robert P. Westerfield, Jr., Montgomery, all of N.Y.

[73] Assignee: International Business Machines Corporation, Armonk, N.Y.

[21] Appl. No.: 579,439

[22] Filed: Sep. 7, 1990

[51] Int. Cl.[5] .................................... H02N 13/00
[52] U.S. Cl. ........................ 361/234; 279/1 M; 29/829
[58] Field of Search .............. 361/234, 233, 230, 231; 279/1 M; 29/829; 118/503, 500; 266/274; 437/924, 925

[56] References Cited

U.S. PATENT DOCUMENTS

| 4,184,188 | 1/1980 | Briglia | 361/234 |
|---|---|---|---|
| 4,383,918 | 5/1983 | Abe | 156/643 |
| 4,502,094 | 2/1985 | Lewin et al. | 361/234 |
| 4,520,421 | 5/1985 | Sakitani et al. | 361/234 |
| 4,554,611 | 11/1985 | Lewin | 361/234 |
| 4,645,218 | 2/1987 | Oshio et al. | 279/1 M |
| 4,665,463 | 5/1987 | Ward et al. | 361/234 |
| 4,692,836 | 9/1987 | Suzuki | 361/234 |
| 4,724,510 | 2/1988 | Wicker et al. | 361/234 |
| 4,733,632 | 3/1988 | Ohmi et al. | 118/729 |

OTHER PUBLICATIONS

H. Bohlen, et al. "Workpiece Holder", Technical Disclosure Bulletin, vol. 20, No. 1 (Jun. 1977).
G. Wardley, "Electrostatic Wafer Chuck for Electron Beam Microfabrication", Rev. Sci. Instrum., vol. 44, No. 10 (Oct. 1973).
G. Fortuno et al. "Electrostatic Wafer Holder for Wafer Cooling During Reactive Ion Etching", IBM Technical Disclosure Bulletin, vol., 31, No. 1 (Jun. 1988).

Primary Examiner—A. D. Pellinen
Assistant Examiner—Richard T. Elms
Attorney, Agent, or Firm—Ratner & Prestia

[57] ABSTRACT

An electrostatic chuck is provided with an electrode split into two sections. The separate sections are joined through a tapered joint and bonded using epoxy. An insulator electrically separates the two sections and covers the top of the joined sections to form a clamping surface. The geometry of the electrode forms three annular regions, dividing the clamping surface into two equal areas distributed symmetrically. Moreover, the split-ring electrostatic chuck just described is fabricated by forming the two, separate electrodes; coating the separate electrodes with an insulator; joining the electrodes; machining the joint, top surface of the electrodes to form a single, co-planar, flat, smooth surface; and applying an insulator to that top surface.

17 Claims, 4 Drawing Sheets

ELECTROSTATIC CHUCK HAVING TAPERED ELECTRODES

BACKGROUND OF INVENTION

A. Field of Invention

The present invention relates, in general, to an electrostatic chuck for holding semiconductor wafers, especially silicon wafers, and to a method for fabricating such a device. More particularly, the present invention relates to a split-electrode electrostatic chuck in which electrical contact to the wafer is not required and to a sequence of operations used to manufacture that chuck.

B. Description of Related Art

In the manufacture of semiconductor devices, care must be taken when processing the semiconductor wafer. Processing treatments may involve directing charged particles toward the wafer. For example, selected areas of the wafer can have their conductivity type modified by implanting ions. As another example, wafers formed of such materials as Si, $SiO_2$, $Si_3N_4$, Al, W, No, Ti and the alloys of these metals and the like may be dry etched using a plasma etch, a sputter etch, or a reactive sputter etch.

Unfortunately, processing treatments involving the use of beams of charged particles generate thermal energy in the wafer. The problems caused by such thermal energy include expansion and local distortion of the wafer and, in the case of a plasma etch, for example, melting of the resist used for the mask. In order to avoid these problems, the heat generated must be dissipated quickly. Additional processing problems are created because the wafers usually are not perfectly flat; they have warps with lengths on the order of a few micrometers.

As is known in the art, improved processing of wafers can be achieved if the wafer is clamped substantially flat against a support base which is temperature controlled during treatment. By clamping the wafer, the number of points of contact between the wafer and the support is increased; therefore, the thermal conductivity between the wafer and support is enhanced, warps are corrected, and the contact area is extended. The improved heat transfer, whether to or from the wafer, enables better control of the temperature of the wafer and, hence, better process control.

Accordingly, a variety of chucks have been proposed to clamp the wafer during processing. Such chucks include mechanical types, vacuum types, and electrostatic types. Electrostatic chucks are particularly useful in the processes which produce semiconductor devices, however, because they can be used under vacuum conditions, do not need mechanical structure to hold the wafer, and can apply a uniform clamping force.

Two general types of electrostatic chucks are known. In the first type, an electrode is positioned on a support base. An insulator is placed over the electrode and, in turn, the wafer is placed over the insulator. Voltage is applied between the electrode and the wafer, creating an electrostatic force of attraction. Because the voltage is applied between the wafer and the electrode, electrical contact with the wafer is required. That requirement limits the material to be held, the wafer, to conductors, semiconductors, or materials at least covered with a conductive material on the surface. Thus, semiconductor wafers covered with an insulator such as an $SiO_2$ film cannot be clamped using the single electrode type of electrostatic chuck.

The second type of electrostatic chuck includes an electrode split into two or more areas, or separate electrodes, which can be held at different potentials. The electrodes, typically planar, are positioned on a support base with a covering insulator and the wafer is placed on the insulator. Voltage is applied between the electrodes, generating a strong electric field which produces an attractive force even if the wafer is coated with an insulator; the wafer is always at a different potential with respect to some part of the split electrodes, regardless of what potential it may assume. Moreover, because the wafer is usually conductive, electrostatic capacities often exist between the wafer and the electrodes.

When the electrode is split into two or more surfaces, problems arise. The force of attraction is very sensitive to small deviations, on the order of a few microns, from the ideal, co-planar position of the surfaces—as well as to surface roughness and flatness in general. It is difficult to isolate the split electrode surfaces electrically yet maintain those surfaces in a flat, co-planar relationship.

Further, in practice, the electrostatic chuck may be part of an rf discharge apparatus. High frequency voltage (rf) is typically supplied through the support and electrode on which the wafer rests. Thus, an rf current flows through the support and electrode to ground or from an rf generator into the discharge through the support and electrode. That rf current may generate different rf potential drops across the support and electrode if the capacitive coupling between the two or more isolated parts of the electrode is too low.

With the above discussion in mind, it is one object of the present invention to provide a split electrode electrostatic chuck having a geometrical design which improves the strength and uniformity of the clamping force of attraction between the chuck and wafer. A second object is to assure that the surface of the split electrode is substantially a single, co-planar, flat, smooth surface. Also of advantage, and a further object, is a maximum thermal contact between the wafer and support.

Still another object of the present invention is to provide a high capacitance between the separate parts of the split electrode to minimize rf voltage drops. Another object is to assure the integrity of the insulator coating of the chuck during manufacture. A related object is to protect the insulating coating of the chuck from the processing treatment applied to the wafer.

SUMMARY OF THE INVENTION

To achieve these and other objects, and in view of its purposes, the present invention provides an electrostatic chuck having an electrode split into two sections. The separate sections are joined through a tapered joint and bonded using epoxy. An insulator electrically separates the two sections and covers the top of the joined sections to form a clamping surface. The geometry of the electrode forms three annular regions, dividing the clamping surface into two equal areas distributed symmetrically.

The split-ring electrostatic chuck just described is fabricated by forming the two, separate electrodes; coating the separate electrodes with an insulator; joining the electrodes; machining the joint, top surface of the electrodes to form a single, co-planar, flat, smooth surface; and applying an insulator to that top surface.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawings, in which.

DETAILED DESCRIPTION OF THE INVENTION

Figure 1:
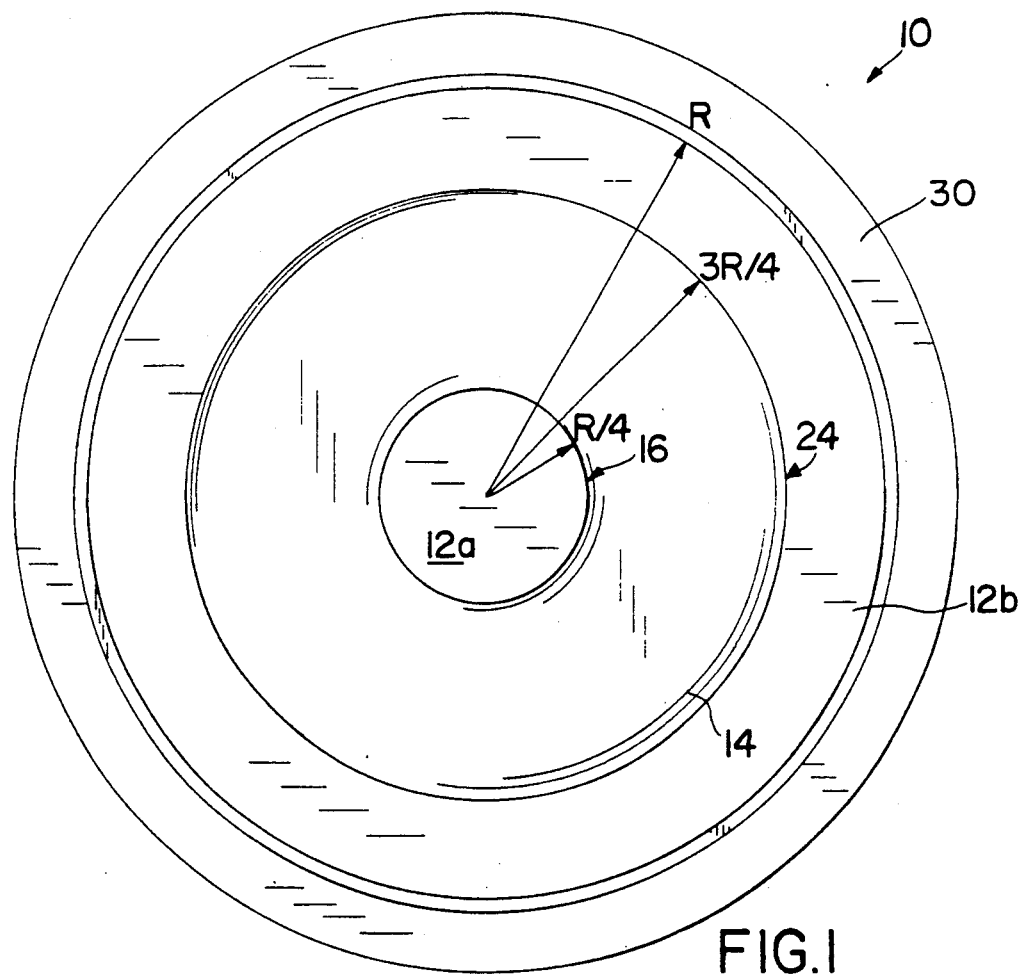
FIG. 1 is a plan view of a split-electrode electrostatic chuck constructed in accordance with the present invention.
Figure 5:
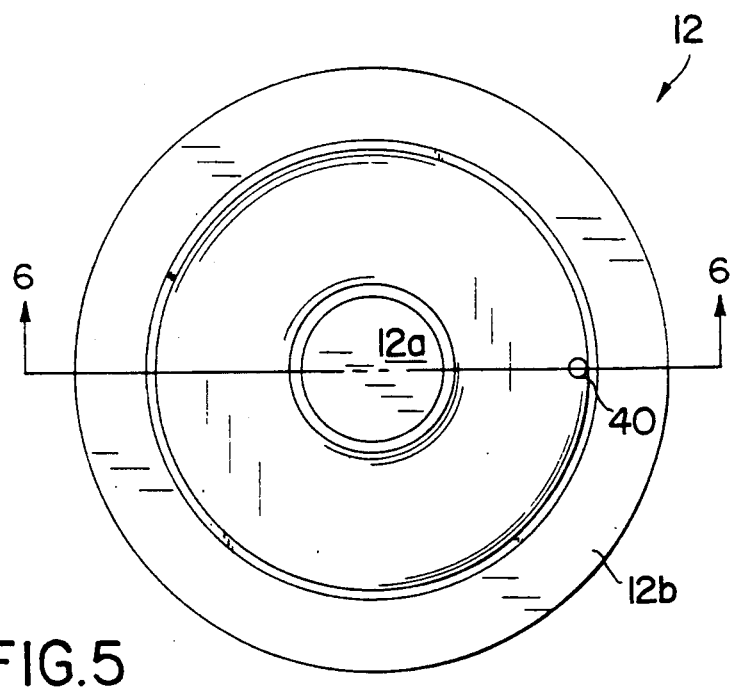
FIG. 5 is a plan view of the first electrode of a split-electrode electrostatic chuck constructed in accordance with the present invention.
Figure 6:
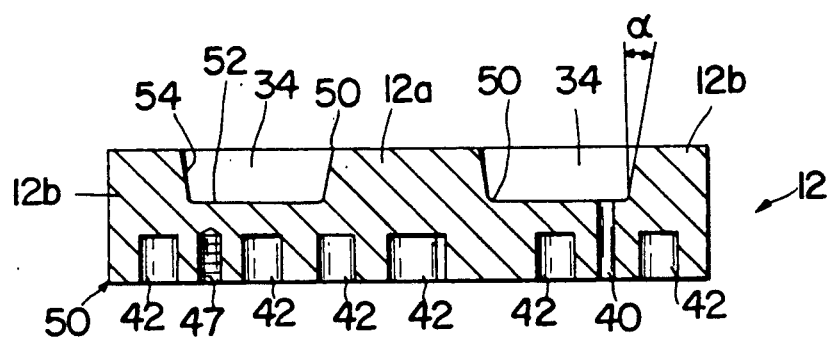
FIG. 6 is a cross-sectional view of the first electrode of a split-electrode electrostatic chuck constructed in accordance with the present invention taken along line 6—6 in FIG. 5.
Figure 7:
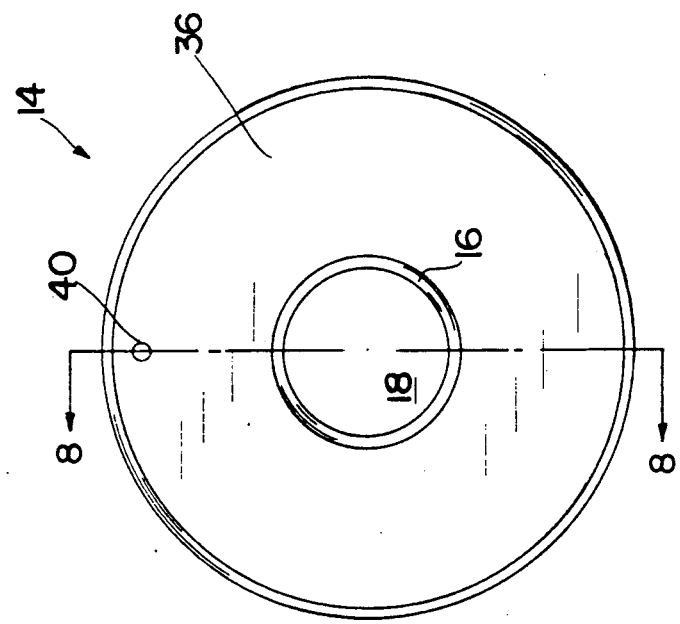
FIG. 7 is a plan view of the second electrode of a split-electrode electrostatic chuck constructed in accordance with the present invention.
Figure 8:
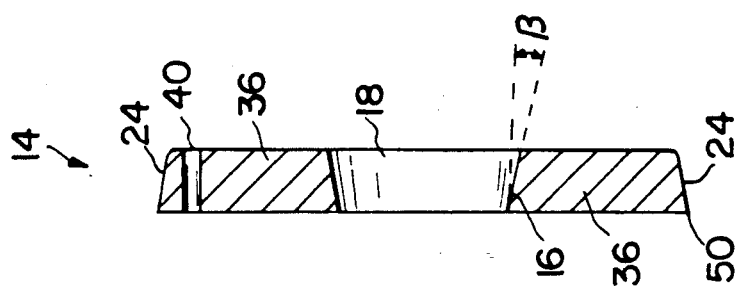
FIG. 8 is a cross-sectional view of the second electrode of a split-electrode electrostatic chuck constructed in accordance with the present invention taken along line 8—8 in FIG. 7.

FIG. 1 shows a split-electrode electrostatic chuck 10 having two, separate electrodes. Second electrode 14 is shaped like a donut (see FIGS. 7 and 8), having a substantially circular wall 16 defining a central opening 18. As shown in FIGS. 5 and 6, first electrode 12 is substantially disc-shaped and has a raised, central, hub portion 12a which engages opening 18 in second electrode 14 and a raised, outer, rim portion 12b which surrounds the outer edge 24 of second electrode 14. Thus, chuck 10 has a hub 12a and a rim 12b which are integrally (and electrically) connected, but which are separated from the middle, donut-shaped electrode 14 of chuck 10.

Figure 2:
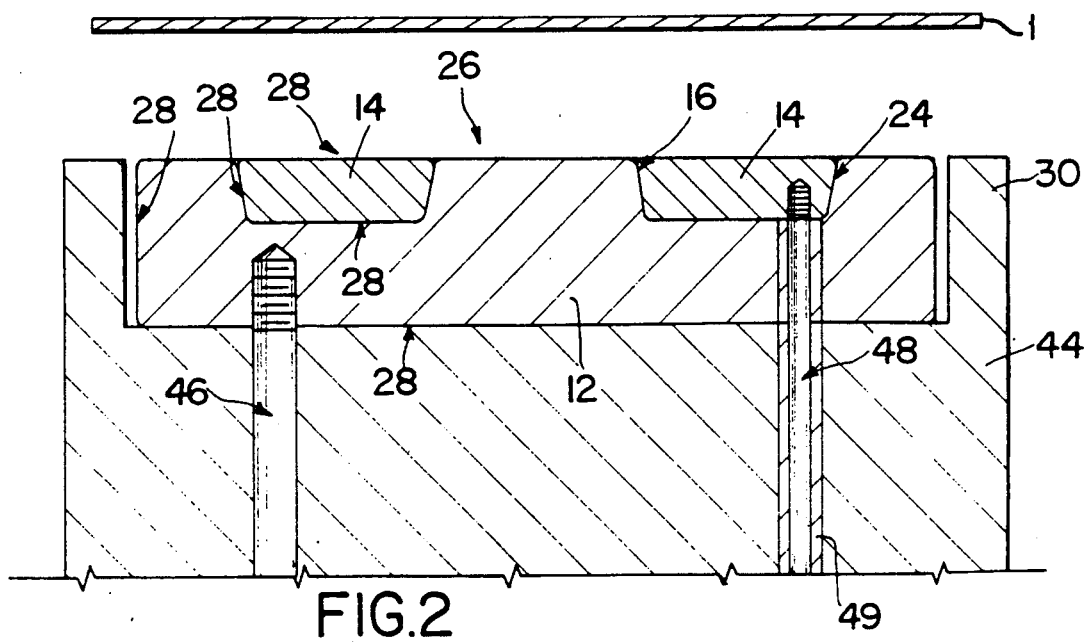
FIG. 2 is a cross-sectional view of the split-electrode electrostatic chuck constructed in accordance with the present invention.

As FIGS. 1 and 2 show, the clamping surface 26 of chuck 10 may be a substantially circular disk, having a radius R, divided into three, annular regions. The boundaries on surface 26 separating those regions are wall 16 and outer edge 24. Preferably, wall 16 is located at a radius of $\frac{1}{2}R$ and outer edge 24 is located at a radius of $\frac{3}{4}R$. Then surface 26 has two, separate, equal, electrode areas: the clamping surface area of both electrode 12 and electrode 14 is $(\pi R^2)/2$. Moreover, the separate clamping surface areas are symmetrically distributed, thus assuring a strong and uniform clamping force.

Electrodes 12 and 14 are coated with a suitable insulator 28, such as anodized aluminum, using a suitable method, such as anodization. For example, insulator 28 may be a hard coat applied using the Alumilite ® (registration of the Aluminum Company of America) process that, at a minimum, meets the requirements of Military Specification No. MIL-A-8625 Type III, Class 1 and produces a heavy, dense coating. Aluminum alloy 6061-T6 is a preferable insulator 28.

The main requirement of the suitable insulator coating, whether it be hard anodization, alumina, or any other insulator medium, and of the coating process used, is that the integral coating be as non-porous, or dense, in crystalline structure as possible. The electrical or breakdown voltage strength of insulator 28 should be at least 500 volts per mil. Insulator 28 should be applied to achieve a thickness of about 0.002 inches.

The semiconductor wafer 1 (shown in FIG. 2 before it is held in position on clamping surface 26) to be processed is held by the clamping surface 26 of chuck 10 on top of insulator 28. The radius, R, of clamping surface 26 is chosen to be smaller than the radius of the wafer by an amount sufficient to assure that the wafer will always cover surface 26—within the bounds of possible wafer positions on chuck 10. For example, if the wafer has a radius of 62.5 millimeters, then the nominal wafer overhang is 2.18 millimeters.

Moreover, a protective ring 30, which may be an anodized aluminum part, surrounds rim 12b of first electrode 12 of chuck 10. By assuring that the wafer will always cover surface 26 of chuck 10 and by providing protective ring 30, the design of the present invention protects insulator 28 from the harmful effects of the processing treatment applied to the wafer. For example, in a plasma etch, the plasma is prevented from accessing insulator 28. The gap between the wafer overhang and ring 30 must be less than some critical dimension to insure protection. In the embodiment of FIG. 1, that dimension is about 0.25 millimeters.

In order to join first electrode 12 and second electrode 14 and form split-ring electrostatic chuck 10, a bond between the two electrodes must be created. The integrity of that bond is critical; chuck 10 must present substantially a single, co-planar, flat, smooth surface 26. The present invention uses an epoxy 32 to form a bond between first electrode 12 and second electrode 14 and to prevent movement and provide sealing.

First electrode 12 has a tapered depression 34 designed to accept band 36 of second electrode 14. Depression 34 is tapered at an angle, $\alpha$, of about ten degrees from normal (see FIG. 6). Band 36 is similarly tapered at an angle, $\beta$, of about ten degrees from normal (see FIG. 8). By correspondingly tapering depression 34 and band 36, excess epoxy 32 can be applied and squeezed out during bonding assembly. This leaves a very thin, void-free epoxy joint.

In many known designs, the electrode or electrodes are placed on a support. In chuck 10 of the present invention, first electrode 12 is formed from a single, conducting block which also functions as a support for second electrode 14, insulator 28, and the wafer. An additional, separate support 44 is provided to support first electrode 12 and to close the cooling channels 42 (see FIG. 4) formed in first electrode 12. As shown in FIG. 2, support 44 may be formed integrally with protective ring 30.

Processing treatments often generate thermal energy in the wafer, which must be dissipated. The design of chuck 10 outlined above assures maximum thermal contact between the wafer and electrodes 12 and 14, which act as a support for the wafer. By controlling the temperature of electrodes 12 and 14, the amount of heat exchanged between the wafer and electrodes 12 and 14 can also be controlled. Such temperature control is provided by two, separate systems.

Figure 3:
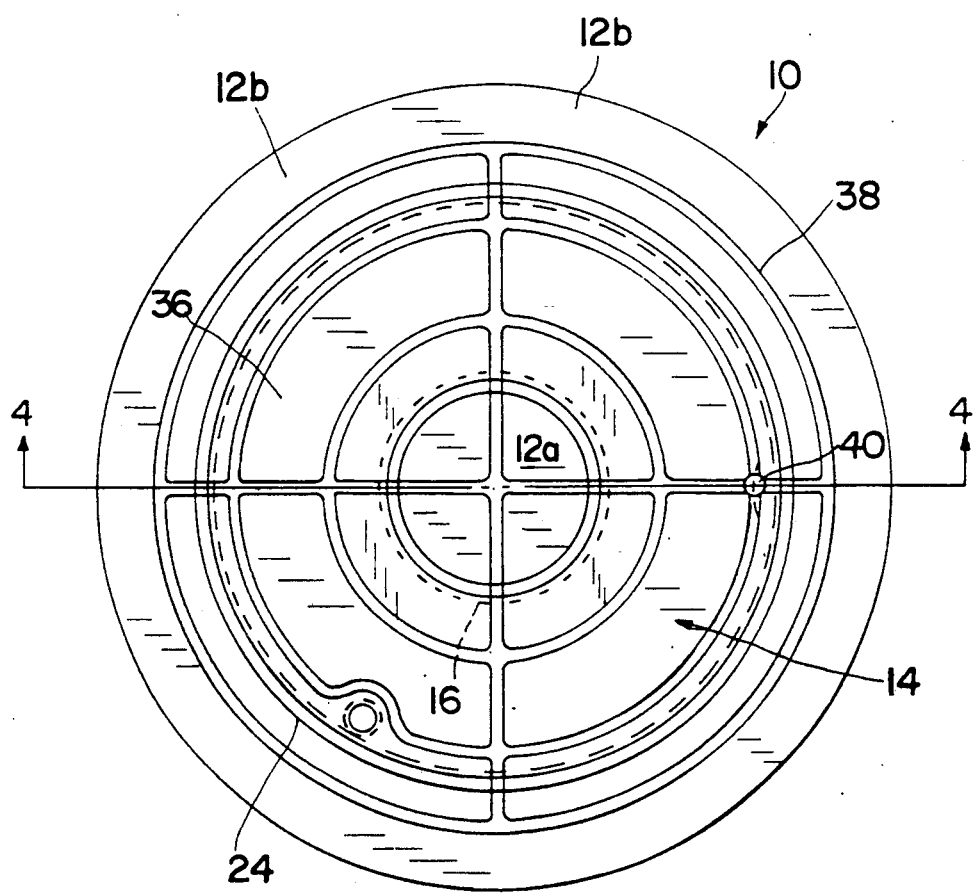
FIG. 3 is a plan view of a split-electrode electrostatic chuck constructed in accordance with the present invention, illustrating cooling structure.
Figure 4:
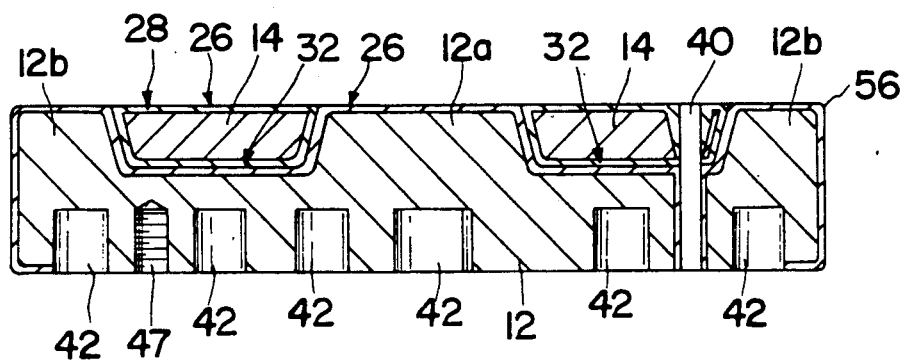
FIG. 4 is a cross-sectional view of the split-electrode electrostatic chuck constructed in accordance with the present invention taken along line 4—4 in FIG. 3.

First, as shown in FIGS. 3 and 4, chuck 10 has a network of gas distribution grooves 38 throughout both first electrode 12 and second electrode 14. A gas supply tube 40 is provided vertically through both first electrode 12 and second electrode 14 to connect grooves 38. A cooling gas, such as Helium, is passed through tube 40 into grooves 38 to transfer heat from the wafer to first electrode 12 and second electrode 14.

Second, first electrode 12 of chuck 10 has a series of cooling channels 42. A fluid such as water can be supplied to channels 42, further cooling first electrode 12 and second electrode 14 and, in turn, dissipating the thermal energy generated in the wafer by the processing treatment.

First electrode 12 and second electrode 14 are held, during operation, at different potentials. As shown in FIG. 2, a first electrical contact 46 is provided to first electrode 12 and a second electrical contact 48 is provided through clearance hole 49 to second electrode 14. Typically, first electrical contact 46 is a bolt which engages threaded aperture 47 (see FIG. 4). Typically, second electrical contact 48 is a partially threaded metal rod which engages a threaded aperture in second electrode 14. Voltage is applied between the electrodes, generating a strong electric field which produces an attractive force clamping the wafer to surface 26 of chuck 10.

Electrical connection may also be made to first electrode 12 by providing a threaded hole in ring 30 for an electrical contact. Typically, the mounting bolts for chuck 10 act as the electrical connection to first electrode 12. Second electrical contact 48 for second electrode 14 may be an electrically isolated through-hole (not shown) in ring 30 through which contact 48 passes. The diameter of the through-hole should exceed the diameter of the tapped hole in second electrode 14 to prevent surface leakage or breakdown. Note that no electrical contact to the wafer is necessary.

The design of chuck 10 outlined above also assures high capacitance between first electrode 12 and second electrode 14. Such high capacitance is achieved because the electrodes are in close proximity at both their horizontal and tapered interfaces. It is desirable because the capacitance must be sufficiently great to render negligible and induced rf voltage difference during operation. For the embodiment of chuck 10 shown in FIG. 1, a capacitance in excess of 2,000 pf is acceptable for many applications. When the expected rf current flow is five amperes (40.6 MHz), that capacitance creates an rf voltage difference of 10 volts—which is tolerable. The required capacitance may be more or less, however, depending upon the application and the frequency.

Chuck 10 described above can be manufactured as follows. First electrode 12 is made from a single, conducting block. Similarly, second electrode 14 is made from a single, conducting block. The thickness of both first electrode 12 and second electrode 14 is oversized to allow later machining, after joining, to form a single, co-planar surface. A gas supply tube 40, which will connect gas distribution grooves 38 when grooves 38 are later formed, is machined vertically through first electrode 12 and second electrode 14. A series of cooling channels 42 are also machined in first electrode 12.

The corners 50 on both first electrode 12 and second electrode 14 are radiused to assure coating integrity at the corners and to assure that the separation between the electrodes 12, 14 at their surface joints is sufficiently large to prevent surface breakdown or leakage. The radii of corners 50 are typically 0.020 inches or larger. First electrode 12 and second electrode 14 are then coated with insulator 28, applied to a thickness of about 0.002 inches, before joining.

An epoxy bond is formed between first electrode 12 and second electrode 14. The tapered depression 34 of first electrode 12 is designed to accept band 36, similarly tapered, of second electrode 14. By correspondingly tapering depression 34 and band 36, excess epoxy 32 can be applied and squeezed out during bonding assembly. The excess epoxy then, of course, is removed. This leaves a very thin, void-free epoxy joint. The dimensions of depression 34 and band 36 are controlled to assure that mechanical contact between first electrode 12 and second electrode 14, through epoxy 32, is made at the bottom 52 of depression 34 rather than at the sides 54 of depression 34. An epoxy-filled gap may be maintained at sides 54, however, which is small—typically less than the thickness of insulator 28.

After joining first electrode 12 and second electrode 14, the top surface 26 of assembled chuck 10 is machined free of the insulator coating. Grinding is not permitted, thus preventing oxide particles from embedding in surface 26. The top surface 26 of the assembled chuck 10 is machined to final dimension, smoothness, and flatness. A network of gas distribution grooves 38 is then machined into the top surface 26. Grooves 38 are radiused to assure coating integrity of the final insulator 28 applied to surface 26. The smoothness and flatness of surface 26 are typically held to 16 microninches and to less than 0.0002 inches, respectively. The outer border 56 of chuck 10 is provided with a radius, typically of 0.030 inches, to move the old insulator-new insulator interface away from clamping surface 26.

Finally, a layer of insulator 28 is applied to the top, clamping surface 26 of chuck 10. Such application may be by any suitable method, including anodization, as discussed above. The thickness of that final layer is typically about 0.002 inches. Thus, the thickness of the insulator 28 formed on the clamping surface 26 is between approximately 0.001 and 0.003 inches.

The design of chuck 10 outlined above has been fabricated and operated successfully in an rf sputter-deposition device. The clamping force created normally exceeds 10 Torr at an applied dc voltage of 650 volts between first electrode 12 and second electrode 14. Such force allows the clamped wafer to be held and cooled properly. More particularly, when a plasma processing treatment is applied to the wafer, the force allows the wafer to "float" to a dc potential determined by that process.

Although the invention is illustrated and described herein as embodied in a split-electrode electrostatic chuck having an electrode split into two sections, the separate sections joined through a tapered joint and bonded using epoxy, an insulator electrically separating the two sections and covering the top of the joined sections to form a clamping surface in which the geometry of the electrode forms three annular regions to divide the clamping surface into two equal areas distributed symmetrically, and in a method for fabricating such a chuck, the invention is nevertheless not intended to be limited to the details shown. Rather, various modifications may be made in the details within the scope and range of equivalents of the claims and without departing from the spirit of the invention. For example, the chuck is described herein as designed for circular semiconductor wafers, but could be applied to other substrates.

What is claimed is:

1. A split-ring electrostatic chuck for holding a semiconductor wafer, said chuck comprising:

a substantially disc-shaped first electrode having a raised central hub portion and a raised outer rim portion forming a depression between said raised hub and said raised rim, said depression having a taper;

a second electrode having a donut shape with a substantially circular wall defining a central opening and an outer edge to form a band between said circular wall and said outer edge, wherein:

(a) said hub of said first electrode engages said central opening of said second electrode, (b) said rim of said first electrode surrounds said outer edge of said second electrode, and (c) said band is adapted to engage said depression of said first electrode and is tapered to correspond to said taper of said depression;

an insulator electrically separating said first electrode from said second electrode and covering the tops of said first electrode and said second electrode to form a clamping surface;

a first electrical contact connected to said first electrode; and a second electrical contact connected to said second electrode, wherein a voltage is applied between said first electrode and said second electrode generating an attractive force for clamping said wafer to said clamping surface.

2. A split-ring electrostatic chuck as claimed in claim 1 wherein said taper of said depression formed between said raised hub and said raised rim of said first electrode and said corresponding taper of said band between said circular wall and said outer edge of said second electrode are about ten degrees from normal.

3. A split-ring electrostatic chuck as claimed in claim 1 wherein said clamping surface defines two, separate, equal electrode areas.

4. A split-ring electrostatic chuck as claimed in claim 3 wherein said equal electrode areas are symmetrically distributed.

5. A split-ring electrostatic chuck as claimed in claim 1 wherein said clamping surface is a single, co-planar, flat smooth surface.

6. A split-ring electrostatic chuck as claimed in claim 1 wherein said clamping surface of said electrostatic chuck has an outer boundary and said semiconductor wafer clamped by said electrostatic chuck on said clamping surface has an outer boundary which extends beyond said outer boundary of said clamping surface.

7. A split-ring electrostatic chuck as claimed in claim 1 further comprising a protective ring surrounding said rim of said first electrode of said electrostatic chuck.

8. A split-ring electrostatic chuck as claimed in claim 7 wherein said protective ring is anodized aluminum.

9. A split-ring electrostatic chuck as claimed in claim 1 wherein an epoxy bond is formed between said first electrode and said second electrode.

10. A split-ring electrostatic chuck as claimed in claim 1 wherein no electrical contact is made to said wafer.

11. A split-ring electrostatic chuck as claimed in claim 1 wherein a capacitance is generated between said first electrode and said second electrode, said capacitance being sufficiently great to render negligible the induced rf voltage difference.

12. A split-ring electrostatic chuck as claimed in claim 1 wherein said electrostatic chuck has a network of gas distribution grooves through said first electrode and said second electrode and a vertically disposed gas supply tube through said first electrode and said second electrode connecting said grooves.

13. A split-ring electrostatic chuck as claimed in claim 12 wherein a cooling gas is passed through said gas supply tube into said network of gas distribution grooves to control the temperature of the semiconductor wafer clamped by said electrostatic chuck on said clamping surface.

14. A split-ring electrostatic chuck as claimed in claim 1 wherein said first electrode has a series of cooling channels for carrying a fluid.

15. A split-ring electrostatic chuck as claimed in claim 1 wherein said insulator has a thickness of between approximately 0.001 and 0.003 inches.

16. A split-ring electrostatic chuck as claimed in claim 15 wherein said insulator has a breakdown voltage strength of at least 500 volts per mil.

17. A split-ring electrostatic chuck as claimed in claim 15 wherein said insulator is anodized aluminum.

* * * * *